(12) United States Patent
Li et al.

(10) Patent No.: US 6,866,900 B2
(45) Date of Patent: Mar. 15, 2005

(54) DEPOSITION AND CHAMBER TREATMENT METHODS

(75) Inventors: Weimin Li, Boise, ID (US); Neal R. Rueger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/460,624

(22) Filed: Jun. 11, 2003

(65) Prior Publication Data

US 2004/0037973 A1 Feb. 26, 2004

Related U.S. Application Data

(63) Continuation of application No. 10/226,849, filed on Aug. 22, 2002, now Pat. No. 6,589,611.

(51) Int. Cl.[7] ............................................. C23C 16/00
(52) U.S. Cl. .................... 427/534; 427/248.1; 427/299; 427/331; 427/337; 427/579; 427/237
(58) Field of Search ............................. 427/248.1, 299, 427/331, 337, 534, 579, 237

(56) References Cited

U.S. PATENT DOCUMENTS 6,465,051 B1 * 10/2002 Sahin et al. ................. 427/534

* cited by examiner

*Primary Examiner*—Timothy Meeks
(74) *Attorney, Agent, or Firm*—Wells St. John P.S.

(57) ABSTRACT

The invention encompasses a method for sequentially processing separate sets of wafers within a chamber. Each set is subjected to plasma-enhanced deposition of material within the chamber utilizing a plasma that is primarily inductively coupled. After the plasma-enhanced deposition, and while the set remains within the chamber, the plasma is changed to a primarily capacitively coupled plasma. The cycling of the plasma from primarily inductively coupled to primarily capacitively coupled can increase the ratio of processed wafers to plasma reaction chamber internal sidewall cleanings that can be obtained while maintaining low particle counts on the processed wafers.

24 Claims, 5 Drawing Sheets

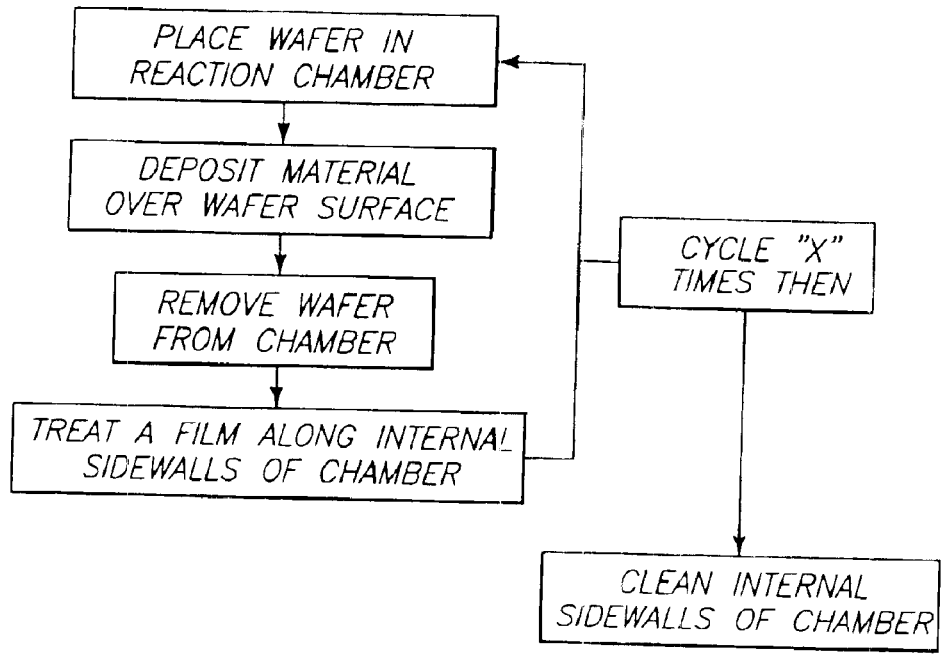
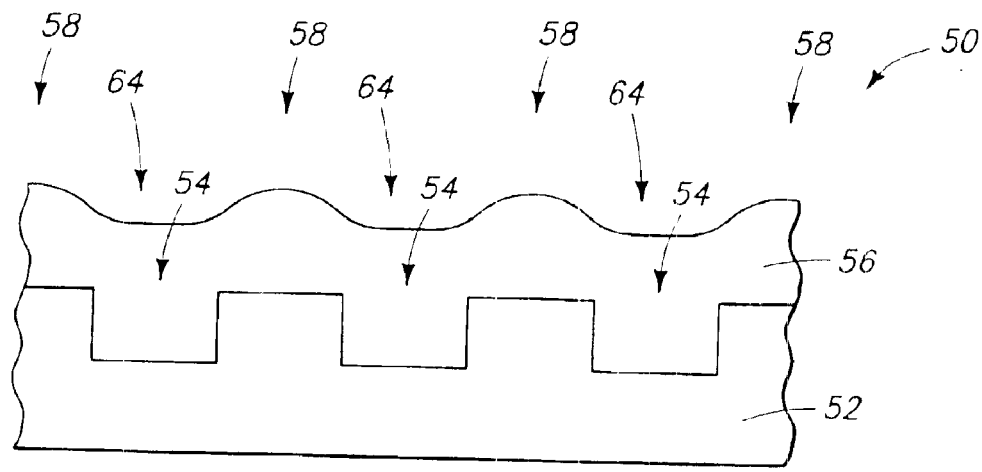

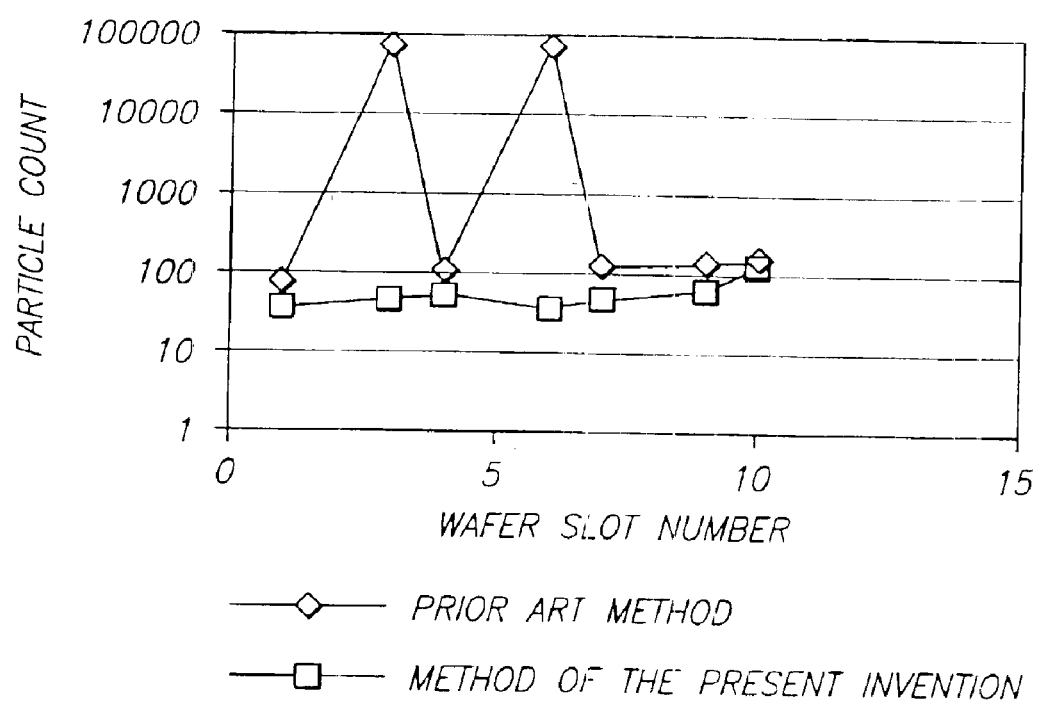

DEPOSITION AND CHAMBER TREATMENT METHODS

RELATED PATENT DATA

This patent resulted from a continuation of U.S. patent application Ser. No. 10/226,849, which was filed on Aug. 22, 2002, which is now U.S. Pat. No. 6,589,611.

TECHNICAL FIELD

The invention pertains to deposition and chamber treatment methods suitable for utilization in semiconductor fabrication processes. In particular aspects, the invention pertains to plasma utilization methods which can increase a ratio of processed wafers to plasma reaction chamber internal sidewall cleanings while maintaining low particle counts on the processed wafers. The invention also pertains to methods which can be utilized for silicon dioxide deposition during, for example, fabrication of shallow trench isolation regions.

BACKGROUND OF THE INVENTION

Plasma-enhanced deposition is commonly utilized during semiconductor fabrication for formation of various compositions. One type of plasma-enhanced deposition is high density plasma chemical vapor deposition (HDP-CVD). The plasma density utilized in an HDP-CVD process contains at least about $10^{11}$ free electrons per cubic centimeter. Other plasma-enhanced deposition processes exist besides HDP-CVD, and the invention described herein can have application not only to HDP-CVD processes, but also to other plasma-enhanced deposition processes.

FIG. 1 illustrates an exemplary conventional apparatus 10 which can be utilized in a plasma-enhanced deposition process. Apparatus 10 includes a reaction chamber 12 comprising a sidewall 14. An inlet port 16 extends through sidewall 14, and an outlet port 18 extends across a bottom periphery of the shown chamber construction. Outlet port 18 has a valve 20 thereunder, and typically a pump would be provided to pull material from within chamber 12 when valve 20 is opened. Another valve (not shown) would typically be associated with inlet port 16 to enable the inlet port to be closed during various operations associated with chamber 12.

A wafer holder 22 is shown within chamber 12. Wafer holder 22 would typically be supported by various structures (not shown) to retain the holder in a desired location within chamber 12.

A semiconductor wafer substrate 24 is illustrated supported by wafer holder (chuck) 22. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A plurality of coils 26 are shown extending around an upper region of chamber 12. In operation, coils 26 are utilized to provide energy for maintaining a plasma within chamber 12. Such plasma is illustrated diagrammatically as a cloud 28 in the illustration of FIG. 1. Plasma 28 can be maintained through either inductive coupling or capacitive coupling relative to coils 26.

Power sources 30 and 32 are shown coupled with coils 26 and wafer holder 22, respectively. Power sources 30 and 32 can be utilized to provide power (such as, for example, radiofrequency power) to one or both of the inductive coils and the wafer holder. Although two power sources are illustrated, it is to be understood that a single power source can be utilized for providing power to both the coils and the substrate holder. In a deposition process, the power provided to holder 22 will be utilized to bias substrate 24 relative to plasma 28 so that species from the plasma will be drawn toward the substrate.

In a typical deposition process, one or more precursors are flowed through inlet 16 and utilized to form the deposit ultimately provided over a surface of substrate 24. The precursors can comprise numerous materials, depending on the deposit that is ultimately desired to be formed. For instance, if the deposit is desired to comprise silicon dioxide, the precursors can include a source of silicon and a source of oxygen. The silicon source can, for example, comprise silane; and the oxygen source can, for example, comprise one or more of hydrogen peroxide, diatomic oxygen, and ozone. Alternatively, the silicon source can comprise tetraethylorthosilicate (TEOS).

As another example, if the deposit is to comprise silicon nitride and/or silicon oxynitride, precursors comprising silicon and one or more of nitrogen and oxygen can be flowed into the chamber. A suitable precursor of silicon is silane, and suitable precursors for one or both of oxygen and nitrogen include $N_2O$, $NH_3$, $N_2$, $O_2$.

A carrier gas can be provided to aid in flow of the precursors into chamber 12, as well as to aid in maintaining plasma 28. The carrier gas can comprise, for example, one or more of argon, helium and nitrogen.

FIG. 2 shows an expanded region of an upper left corner of reaction chamber 12 after a deposition process has commenced. A film 40 has formed along an internal surface of sidewall 14. Film 40 is a by-product of the formation of a deposit within chamber 12, and can comprise the same composition as the deposit formed on substrate 24 (FIG. 1), or a different composition. The composition of film 40 includes materials from the precursors flowed into the reaction chamber. Accordingly, if the precursors comprise one or more of silane, oxygen and nitrogen, film 40 will typically comprise, consist essentially of, or consist of one or more of silicon, oxygen and nitrogen.

Material can flake from the film and fall onto a substrate (24 of FIG. 1) within the reaction chamber to form particles across the substrate. The particles can cause numerous problems. For instance, the particles can be detrimental to chemical-mechanical polishing processes in that the particles can gouge a surface during the chemical-mechanical polishing. Also, the particles can be buried in subsequent process steps following a deposition process, and disrupt devices formed over the particles. Further, the particles can interfere with photolithographic processing.

Since particles resulting from flaking of material 40 are problematic, numerous procedures have been developed for removing material 40 from an internal sidewall of reaction chamber 14. Such processes typically comprise cleaning an internal surface of the reaction chamber after a wafer is processed within the chamber.

An exemplary prior art process for depositing material on a wafer surface and cleaning a reaction chamber is described with reference to FIG. 3. Initially, a wafer is placed within the reaction chamber. A deposit is then formed over the wafer surface, and the wafer is subsequently removed from the reaction chamber. After the wafer has been removed from the reaction chamber, interior sidewalls of the chamber are cleaned (typically a dry clean), and then the process can be repeated to treat another wafer. Accordingly, in typical prior art processes a single wafer is processed prior to cleaning internal sidewalls of a reaction chamber. It is noted that some chambers are configured to process a batch of two or more wafers. In such processes, material is deposited over the batch of wafers, and the batch is subsequently removed from the wafer prior to cleaning interior sidewalls of the chamber. In any event, typical prior art processes comprise providing a set of one or more wafers within a reaction chamber, forming a deposit over the set of wafers, and then cleaning interior sidewalls of the chamber before another set of wafers is-processed.

The processing described above is typical for so-called cold wall chambers. Another type of chamber design is a so-called hot wall chamber. Hot wall chambers can have an internal periphery of a sidewall at a higher temperature than treated substrates, and such can reduce a rate of formation of a film along an internal periphery of the chamber relative to the rate of deposition of a material on a substrate. Accordingly, the time between cleanings of the chamber internal sidewalls can be extended and it is not uncommon for hot wall chambers to be cleaned after 3 or 4 batches of wafers, rather than after every batch of wafers.

Regardless of what type of chamber is utilized for forming deposits over wafers (i.e., regardless of whether the chamber is a hot wall or a cold wall chamber), it would be desirable to extend the number of wafers that can be processed by the chamber between cleanings. Extending the number of wafers that can be processed between cleanings can improve wafer throughput, and accordingly can improve the economy of utilizing a chamber.

As discussed previously, an exemplary utilization of deposition methodologies is formation of shallow trench isolation regions. A process of forming shallow trench isolation regions is described with reference to FIGS. 4–6.

Referring initially to FIG. 4, a fragment of a semiconductor wafer construction 50 is illustrated. Construction 50 comprises a semiconductive material mass 52. Mass 52 can comprise, consist essentially of, or consist of, for example, monocrystalline silicon. A series of trenches 54 have been formed to extend into mass 52.

Referring to FIG. 5, an insulative material 56 is deposited over mass 52 and within trenches 54. Material 56 can comprise, consist essentially of, or consist of, for example, silicon dioxide, or silicon dioxide doped with one or both of phosphorus and fluorine. Material 56 can be formed by high density plasma enhanced deposition methodologies.

Material 56 comprises a plurality of peaks 58 and valleys 60, as deposited. The peaks 58 are relatively sharp, which is typical of silicon dioxide formed utilizing a high density plasma deposition process.

FIG. 6 illustrates construction 50 after it has been subjected to a planarization process, such as, for example, a chemical-mechanical polishing process. Such process removes peaks 58 (FIG. 5). The planarization also reduces an uppermost elevation of material 56 to form a planarized upper surface 62 extending across material 56 and an upper surface of mass 52. The material 56 remaining within trenches 54 defines trenched isolation regions. If the trenches are relatively shallow, the isolation regions can be referred to as shallow trench isolation regions.

Methodology of the present invention is described herein which can be utilized for treating a film on an internal periphery of a reaction chamber surface to extend a time between cleanings of the reaction chamber. Such methodology can have application to cold-wall reaction chamber deposition processes and hot-wall reaction chamber deposition processes. In particular aspects, the methodology can have application to processes utilized in the formation of trenched isolation regions.

SUMMARY OF THE INVENTION

In one aspect, the invention encompasses a method for sequentially processing separate sets of wafers within a chamber. Each set is subjected to plasma-enhanced deposition of material within the chamber utilizing a plasma that is primarily inductively coupled. After the plasma-enhanced deposition, and while the set remains within the chamber, the plasma is changed to a primarily capacitively coupled plasma. The cycling of the plasma from primarily inductively coupled to primarily capacitively coupled can increase the ratio of processed wafers to plasma reaction chamber internal sidewall cleanings that can be obtained while maintaining low particle counts on the processed wafers.

In one aspect, the invention encompasses a deposition method of forming an insulative material over a wafer. A substrate is provided within a reaction chamber. The reaction chamber has an internal surface. A plasma is formed within the chamber. While the plasma is within the chamber, a silicon precursor and at least one of an oxygen precursor and a nitrogen precursor are flowed into the chamber. One or more of silicon dioxide, silicon nitride and silicon oxynitnde are deposited onto the substrate from the precursors. A material (e.g., a film) forms on the internal surface of the chamber during the depositing. After the deposit is formed on the substrate, the flow of silicon precursor is at least substantially stopped. Subsequently, one or more noble gasses (such as, for example, one or more of argon, neon, helium, krypton and xenon) are flowed into the chamber and the plasma is utilized to generate activated species from the one or more noble gasses. The material along the sidewalls of the reaction chamber is impacted by the species generated from the one or more noble gasses to alter the material on the Internal surface of the chamber.

BRIEF DESCRIPTION OF THE DRAWINGS

Preferred embodiments of the invention are described below with reference to the following accompanying drawings.

FIG. 8 is a flow-chart diagram of another exemplary process of the present invention for forming a deposit over a wafer surface and subsequently treating internal sidewalls of a reaction chamber.

FIG. 9 is a diagrammatic, cross-sectional view of a semiconductor wafer fragment shown at a processing step subsequent to the prior art processing of FIG. 5, in accordance with an exemplary aspect of the present invention.

FIG. 10 is a graphical illustration comparing wafers processed in accordance with methodology of the present invention to wafers processed in accordance with prior art methodology.

DETAILED DESCRIPTION OF THE PREFERRED EMBODIMENTS

The invention includes methods of treating a material (or film) along internal sidewalls of a reaction chamber to increase the number of wafers that can be treated between cleanings of the internal sidewalls of the reaction chamber. As a film forms along an internal sidewall of a reaction chamber, the film eventually reaches a thickness at which it begins to peel off the chamber wall. Particles from the peeling film can fall onto a wafer within the chamber and cause various problems discussed previously in the "Background" section of this disclosure. The invention includes processes for treating a film along an internal sidewall of a reaction chamber to increase the thickness of the film that can occur before peeling begins. Since the treated film can become thicker before peeling and causing particles, more wafers can be processed than could have been processed without the treatment. The throughput of HDP-CVD processes can be limited by the frequency with which cleaning of internal sidewalls of a reaction chamber is done. Accordingly, a process that can run 1 clean for every 5 deposition wafers (typically referred to as a 5× clean) can have a higher throughput than one that can only run one clean for every 3 depositions (typically referred to as a 3× clean). Accordingly, treatment of a film deposited on an internal sidewall can increase the throughput of an HDP-CVD process.

Figure 7:
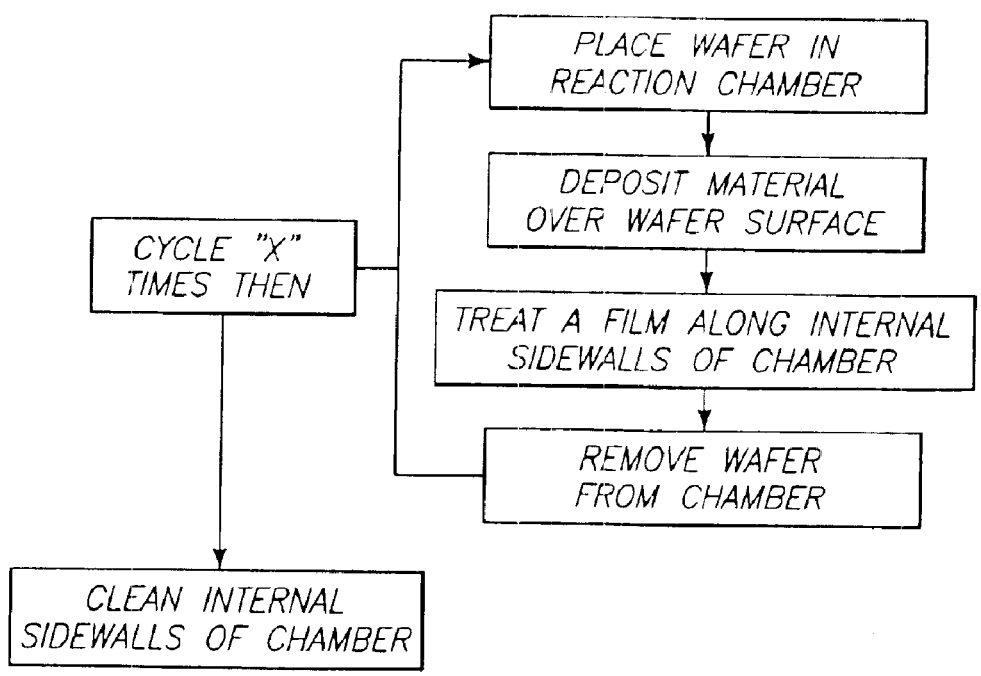
FIG. 7 is a flow-chart diagram describing an exemplary process of the present invention for depositing material over a wafer surface, and subsequently treating internal sidewalls of a reaction chamber.

Exemplary processes of the present invention are described with reference to flow charts shown in FIGS. 7 and 8. Referring initially to FIG. 7, a wafer is placed in a reaction chamber and a material is deposited over a surface of the wafer. The deposition of material over the wafer surface can be accomplished utilizing methods described above in the "Background" section of this disclosure, and accordingly the material can comprise, for example, one or more of silicon, oxygen and nitrogen. Of course, other materials can be deposited, including materials comprising, for example, Ge, metals and/or carbon.

The deposition of the material over the wafer surface can occur during an HDP-CVD process, or during other plasma-enhanced processes. Further, although the method of FIG. 7 refers to a single wafer being processed, it is to be understood that the processing can be accomplished relative to a batch of wafers provided within the reaction chamber. The term "set" can be utilized herein to refer to wafers processed at a single time within a reaction chamber. It is to be understood that a wafer set can be a single wafer, or can be a batch comprising a plurality of wafers.

In particular aspects of the invention, the deposit is formed over the wafer surface utilizing plasma-enhanced deposition with a plasma which is primarily inductively coupled. The term "primarily inductively coupled" is used to indicate that most of the power supplied to the plasma is inductively coupled with the plasma, but that some other coupling can be present, such as, for example, capacitive coupling.

The wafer can be biased relative to the plasma during the formation of the deposit over the wafer surface.

In exemplary processing, the deposit over the wafer surface comprises silicon and one or more of nitrogen and oxygen, such as, for example, silicon dioxide, silicon nitride, and silicon oxynitride. Such materials can be formed by flowing a silane precursor into a reaction chamber together with one or more of $N_2$, $NH_3$, $N_2O$, and $O_2$. Alternatively, silicon dioxide can be formed from a TEOS precursor.

In one exemplary method of the present invention, the material deposited over the wafer surface is silicon dioxide, and is formed by flowing silane and one or more oxygen precursors into the reaction chamber. The plasma within the reaction chamber is powered with a radio frequency power of at least 3,000 watts, and in some applications even greater than 4,000 watts. The deposition of the silicon dioxide can be accomplished by conventional processing, and accordingly the wafer can be biased relative to the plasma within conventional parameters. As a material is deposited on the wafer, a film forms on the chamber sidewalls as described previously in the "Background" section of this disclosure. After the material has been deposited on the wafer surface, the next step of the FIG. 7 process is to treat the film formed along the internal sidewalls of the chamber to enhance adhesion of the film along the sidewalls. The treatment can be accomplished by changing the conditions within the reaction chamber from deposition conditions to conditions which expose internal sidewall peripheries of the reaction chamber to activated species formed from the plasma. Such change in the conditions within the reaction chamber can include reducing a flow of one or more precursors into the chamber and/or changing the plasma from being primarily inductively coupled to being primarily capacitively coupled.

In an exemplary process, a silicon-containing precursor and a non-silicon-containing precursor are flowed into the reaction chamber during the deposition process, and the flow of the silicon-containing precursor is at least substantially ceased during the change from the deposition process to the sidewall treatment process. The term "substantially ceased" is utilized to indicate that the flow of the silicon-containing precursor is reduced to a suitable level so that no appreciable deposition of material occurs on the substrate during the treatment process. In particular aspects of the invention, the flow of the silicon-containing precursor can be entirely ceased during the deposition process. In aspects in which silicon dioxide is formed from silane and an oxygen precursor, it can be the flow of silane which is at least substantially ceased, and in particular aspects entirely ceased. The flow of the non-silicon precursor can also be reduced in applications where such is desired.

The invention can include replacement of the flow of a silicon-containing precursor (and/or another precursor) with a flow of one or more noble gasses (such as, one or more of argon, neon, helium, krypton and xenon). In aspects in which silicon dioxide is formed from silane and $O_2$, and in which the flow of silane is replaced with a flow of one or more of argon, xenon, helium, krypton and neon; it will be $O_2$ and one or more of argon, xenon, helium, krypton and neon flowed into the reaction chamber during the treatment of the internal sidewalls of the reaction chamber. The materials flowed into the reaction chamber can form activated species within the plasma, and such activated species can impact the film along the internal sidewalls of the reaction chamber to alter properties of the film and thereby enhance adhesion of the film onto the internal sidewalls of the reaction chamber. Such enhancement of the adhesion can include enhancing an interaction between the film and the sidewall of the reaction chamber and/or enhancing interactions within the film itself to density the film and otherwise alleviate flaking of materials from the film.

The power supplied from the coils to the plasma while the plasma is primarily capacitively coupled can be less than 1,000 watts, but remains sufficient to maintain the plasma: In particular aspects of the invention, the substrate is not biased relative to the plasma during the treatment of the internal surfaces of the sidewall chamber. In other aspects, the substrate is biased relative to the plasma. The bias of the substrate relative to the plasma can be greater than 0, but less than or equal to 2,000 watts; and in particular applications can be from about 700 watts to about 1000 watts. Biasing of the substrate relative to the plasma can be useful in applications in which it is desired to impact activated species from the plasma onto the substrate to accomplish an etch or polish of various regions of the substrate (e.g., wafer) during the treatment of the film along the internal sidewall periphery of the reaction chamber.

After the film along the internal sidewalls of the chamber has been treated, the wafer can be removed from within the chamber. Subsequently, another wafer can be placed within the chamber and cycled through the above-described processing. Again, it is to be understood that although a single wafer is described in the flow diagram of FIG. 7, it can actually be batches of wafers processed at a single time within the reaction chamber. Each set processed within the reaction chamber can be considered to be sequentially processed relative to the other sets processed within the reaction chamber.

The cycling of sets of wafers through the reaction chamber is repeated "X" times, and then the internal sidewalls of the reaction chamber are cleaned. The number of times that sets of wafers can be cycled through the reaction chamber between cleanings of the internal sidewalls of the chamber can depend upon the tolerance for particles on processed wafers. However, for a given tolerance, the processing of the present invention can extend the number of wafers which can be processed between cleanings of the chamber sidewalls. Such is evidenced by the graph of FIG. 10, which shows the particle count across wafer surfaces when utilizing conventional methodologies and a 3× clean, relative to the particle count across wafer surfaces utilizing methodology of the present invention. The FIG. 10 graph illustrates that 3 sets of wafers can be sequentially processed in accordance with methodology of the present invention without cleaning internal sidewalls of a reaction chamber, and while maintaining a particle count per wafer at less than about 100. Other data (not shown) indicates that at least 5 sets of wafers can be sequentially processed utilizing methodology of the present invention between cleanings of reaction chamber internal sidewalls while maintaining a particle count per wafer of less than about 100. Additional data (not shown) indicates that at least 10 sets of wafers can be sequentially processed utilizing methodology of the present invention between cleanings of reaction chamber internal sidewalls while maintaining a particle count per wafer of less than about 220.

The data shown in the graph of FIG. 10 and the other data described above indicates processing of the present invention can increase the ratio of processed wafers to plasma reaction chamber internal sidewall cleanings that can be obtained while maintaining low particle counts on the processed wafers relative to the ratio that would be obtained by conventional processing.

Referring to FIG. 8, the process described therein is similar to that of FIG. 7, but comprises removal of the wafer from within the reaction chamber prior to treating the film along with the internal sidewalls of the chamber, rather than leaving the wafer within the chamber during the treatment of the film. The conditions utilized for treating the internal sidewalls of the chamber of the FIG. 8 process can be identical to those described above with reference to the FIG. 7 process. Also, the number of times "×" that sets of wafers are cycled through the FIG. 8 process between cleanings can be identical to that described with reference to the process of FIG. 7.

The process of FIG. 8 implies that no wafer is within the chamber during the treatment of the film along the internal sidewalls of the chamber. Specifically, the process of FIG. 8 shows a wafer placed within the chamber, a material deposited over a surface of the wafer, and the wafer then removed from the chamber prior to the treatment of the film along the internal sidewalls of the chamber. Another process of the invention (not shown) is similar to that of FIG. 8, except that a second wafer is provided within the chamber after removal of the wafer having the material deposited over its surface and prior to the treatment of the internal sidewalls. Specifically, a first wafer has the material deposited over its surface and is then removed from the chamber. The second wafer is subsequently provided within the chamber prior to the treatment of the internal sidewalls of the chamber. After the internal sidewalls are treated, the second wafer can be subjected to deposition conditions within the chamber which deposit the material over a surface of the second wafer. It can be advantageous to have a wafer within the chamber during the treatment of the internal sidewalls of the chamber to protect the wafer holder (chuck).

Figure 1:
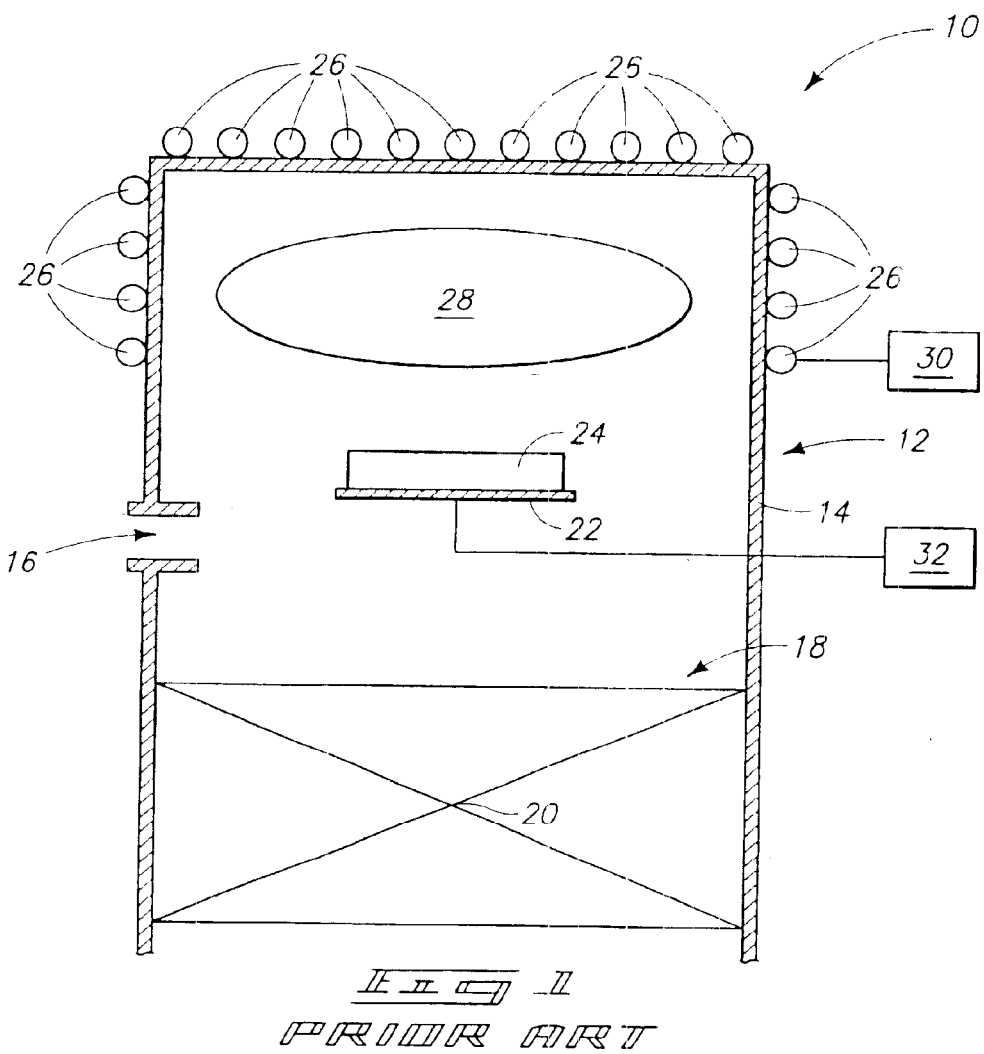
FIG. 1 is a diagrammatic, cross-sectional view of a prior art apparatus that can be utilized for a plasma-enhanced deposition process.
Figure 2:
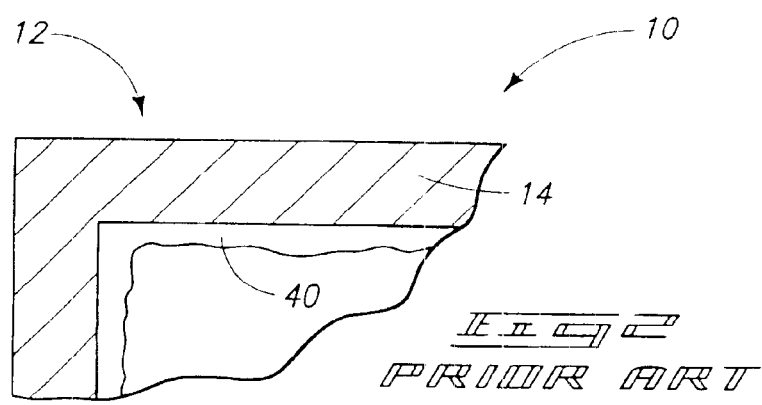
FIG. 2 is an expanded view of a region of the FIG. 1 apparatus shown during a deposition process.
Figure 3:
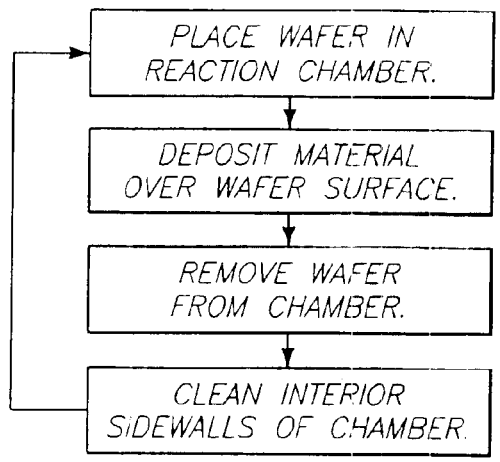
FIG. 3 is a flow-chart describing a prior art process for deposition of material on a substrate surface, and subsequent cleaning of an internal surface of a reaction chamber.
Figure 4:
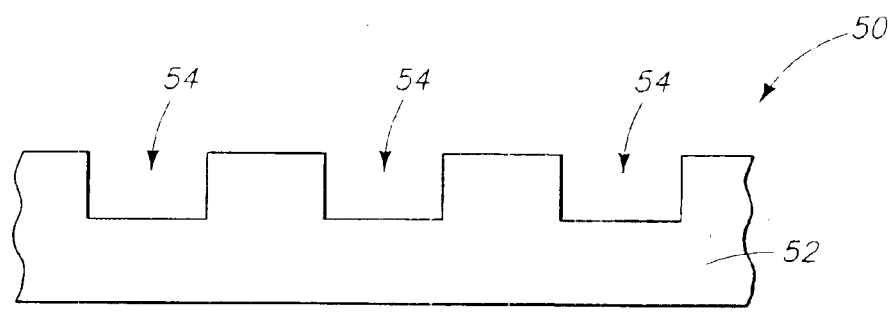
FIG. 4 is a diagrammatic, cross-sectional view of a semiconductor construction at a preliminary prior art processing step for forming trenched isolation regions.
Figure 5:
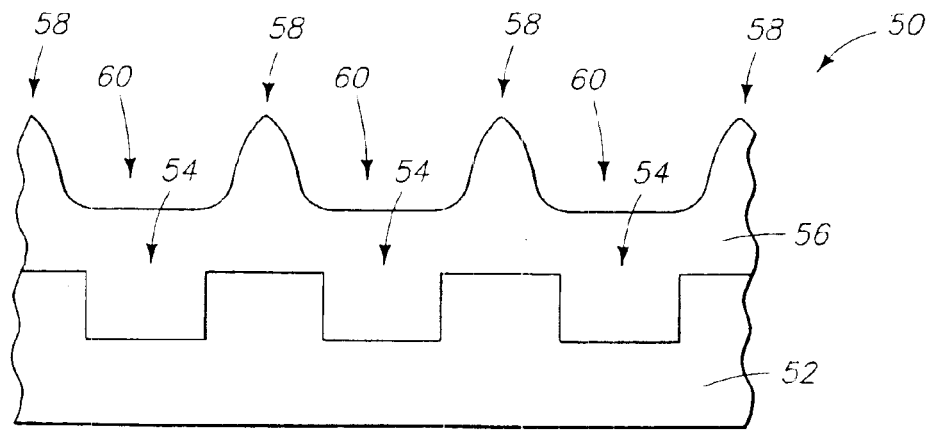
FIG. 5 is a view of the FIG. 4 wafer fragment shown at a prior art processing step subsequent to that of FIG. 4.

FIG. 9 illustrates an application of a particular aspect of the present invention. More specifically, FIG. 9 illustrates the wafer construction 50 which was described above with reference to FIG. 5, at a processing step subsequent to that of FIG. 5 in accordance with an aspect of the present invention.

Figure 6:
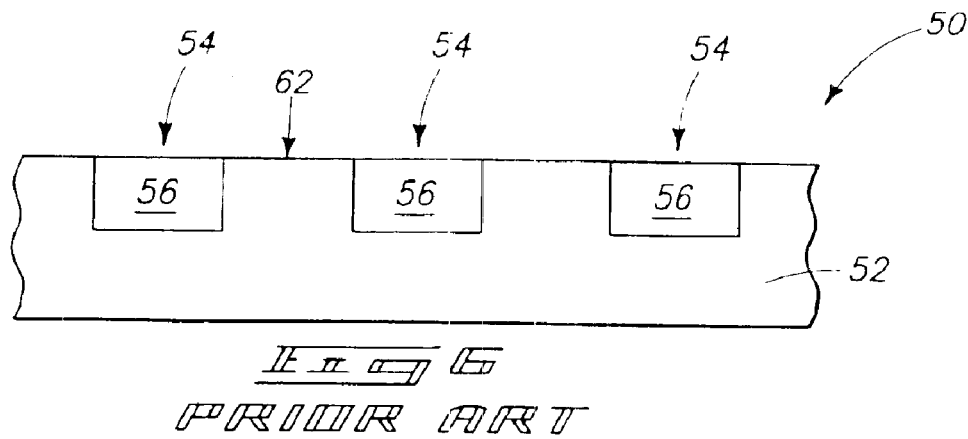
FIG. 6 is a view of the FIG. 4 wafer fragment shown at a prior art processing step subsequent to that of FIG. 5.

Construction 50 includes the material 56 formed over mass 52. The peaks 58 have been reduced in height relative to the height of such peaks at the processing step of FIG. 5. In other words, an elevational height of the peaks has been reduced from a first elevational height present at the prior art processing step of FIG. 5 to a second elevational height above substrate 52 which is less than the first elevational height. Such reduction can be accomplished by leaving the semiconductor wafer substrate within the reaction chamber during the treatment of internal sidewalls of the chamber, as discussed above with reference to FIG. 7, and then biasing the substrate relative to the plasma in the chamber during the treatment of the film along the internal sidewalls of the chamber. The biasing of the substrate relative to the plasma causes activated species from the plasma to impact an upper surface of the substrate and smooth the peaks extending across such upper surface. The smoothing of the peaks reduces topographical differences across an upper surface of the construction 50. Reduction of the topographical differences can improve planarization achieved by chemical-mechanical polishing (or other processes) during formation of the isolation regions 56 described above with reference to FIG. 6.

EXAMPLE

After deposition of silicon dioxide on a semiconductor wafer utilizing silane and $O_2$ as precursors, the treatment of a film along an internal periphery of the chamber proceeds as follows; with the wafer remaining in the chamber during the treatment. The flow of silane is stopped. Argon and $O_2$ are each flowed into the chamber at 50 standard cubic centimeters per minute (sccm), (the flow of each of $O_2$ and Ar can be from about 10 sccm to about 1000 sccm). A power of about 1000 watts is provided to the coils around the chamber to maintain a primarily capacitively coupled plasma within the chamber (the power can be higher, for example, up to about 5000 watts, if a primarily capacitively coupled plasma can be maintained). No bias is provided to the wafer (but bias can be provided in other applications). A pressure of about 3 mTorr is maintained in the chamber during the treatment (the pressure can be from greater than 0 mTorr to about 100 mTorr). The treatment time is about 25 seconds.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A plasma utilization method, comprising:
   sequentially processing production wafers as separate sets within a reaction chamber; and
   while each set is within the chamber, utilizing a primarily inductively coupled plasma within the chamber for a first period of time, the primarily inductively coupled plasma being the only plasma within the chamber for said first period of time; and while each set remains within the chamber, utilizing a primarily capacitively coupled plasma within the chamber for a second period of time which does not overlap with said first period of time, the primarily capacitively coupled plasma being the only plasma within the chamber for the said second period of time.

2. A plasma utilization method for increasing a ratio of processed wafers to plasma reaction chamber internal sidewall cleanings while maintaining low particle counts on the processed wafers, comprising:
   sequentially processing the wafers as separate sets within the reaction chamber;
   while each set is within the chamber, plasma-enhanced depositing of a material on the wafers of the set while the plasma is primarily inductively coupled, the material being formed over portions of the reaction chamber; and
   after the depositing and while the set remains in the chamber, changing the plasma to a primarily capacitively coupled plasma to alter properties of the material formed over the portions of the reaction chamber, wherein the altered properties alleviate flaking of the material from the portions of the reaction chamber.

3. The method of claim 2 wherein each set comprises only a single wafer, and wherein at least three sets are processed without cleaning the reaction chamber internal sidewalls.

4. The method of claim 2 wherein at least three sets are processed without cleaning the reaction chamber internal sidewalls while maintaining a particle count per wafer at less than about 100.

5. The method of claim 2 wherein at least five sets are processed without cleaning the reaction chamber internal sidewalls while maintaining a particle count per wafer at less than about 100.

6. The method of claim 2 wherein at least ten sets are processed without cleaning the reaction chamber internal sidewalls while maintaining a particle count per wafer at less than about 220.

7. The method of claim 2 wherein the deposited material comprises one or more of silicon dioxide, silicon nitride and silicon oxynitride.

8. The method of claim 2 wherein the deposited material comprises carbon.

9. The method of claim 2 wherein the deposited material comprises Ge.

10. The method of claim 2 wherein the deposited material comprises metal.

11. A deposition and chamber treatment method comprising:
    providing a substrate within a reaction chamber, the reaction chamber having at least one internal sidewall around the substrate;
    flowing one or more precursors within the chamber and forming a deposit over the substrate from the one or more precursors;
    forming a material along the at least one sidewall from the one or more precursors;
    while the substrate remains in the chamber:
    ceasing the flow of at least one of the one or more precursors;
    providing an activated species within the chamber; and
    impacting the material along the at least one sidewall with the activated species to treat the material, and wherein the treating enhances adhesion of the material with the at least one sidewall to impede flaking of the material from the at least one sidewall.

12. The method of claim 11 wherein:
    the deposit comprises silicon and nitrogen;
    the precursors include a silicon-containing precursor and nitrogen-containing precursor; and
    the ceasing the flow of the at least one precursor comprises ceasing the flow of the silicon-containing precursor and does not comprise ceasing the flow of the nitrogen-containing precursor.

13. The method of claim 11 wherein:
    the deposit comprises silicon and oxygen;
    the precursors include a silicon-containing precursor and oxygen-containing precursor; and
    the ceasing the flow of the at least one precursor comprises ceasing the flow of the silicon-containing precursor and does not comprise ceasing the flow of the oxygen-containing precursor.

14. The method of claim 11 wherein the precursors include silane and one or more of $NH_3$, $N_2O$ and $O_2$; and wherein the ceasing the flow of at least one precursor comprises ceasing the flow of the silane.

15. The method of claim 11 wherein the precursors include silane and or more of $N_2$, $NH_3$, $N_2O$ and $O_2$; and wherein the ceasing the flow of at least one precursor comprises ceasing the flow of the silane and not ceasing the flow of the one or more of $N_2$, $NH_3$, $N_2O$ and $O_2$.

16. The method of claim 11 wherein the providing the activated species comprises flowing one or more of Ar, Ne, He, Kr and Xe into the chamber and generating the activated species from the one or more of the Ar, Ne, He, Kr and Xe.

17. A plasma utilization method for increasing a ratio of proceeded production wafers to plasma reaction chamber internal sidewall cleanings while maintaining low particle counts on the production wafers, comprising:

sequentially processing the production wafers as separate sets within the reaction chamber;

while each set is within the chamber and during a first period of time, plasma-enhanced depositing of a material on the wafers of the set while the plasma is primarily inductively coupled; and after the depositing and while the set remains in the chamber, changing the inductively coupled plasma to a primarily capacitively coupled plasma during a second period of time which does not overlap with said first period of time, the primarily capacitively coupled plasma being the only plasma within the chamber for the said second period of time.

18. The method of claim 17 wherein each set comprises only a single wafer, and wherein at least three sets are processed without cleaning the reaction chamber internal sidewalls.

19. The method of claim 17 wherein at least three sets are processed without cleaning the reaction chamber internal sidewalls while maintaining a particle count per wafer at less than about 100.

20. The method of claim 17 wherein at least five sets are processed without cleaning the reaction chamber internal sidewalls while maintaining a particle count per wafer at less than about 100.

21. The method of claim 17 wherein at least ten sets are processed without cleaning the reaction chamber internal sidewalls while maintaining a particle count per wafer at less than about 220.

22. A plasma utilization method, comprising:

sequentially processing wafers as separate sets within a reaction chamber;

while each set is within the chamber, utilizing a primarily inductively coupled plasma within the chamber for a period of time to form a material over each set of wafers and to form the material over a sidewall portion of the reaction chamber; and while each set remains within the chamber, changing the plasma to a primarily capacitively coupled plasma for another period of time to improve adhesion of the material to the sidewall portion.

23. The method of claim 22 wherein the adhesion of the material to the sidewall portion is improved by thickening the material without substantial flaking of the material.

24. The method of claim 22 wherein the adhesion of the material to the sidewall portion is improved by densifying the material without substantial flaking of the material.

* * * * *

UNITED STATES PATENT AND TRADEMARK OFFICE
CERTIFICATE OF CORRECTION

PATENT NO. : 6,866,900 B2
DATED : March 15, 2005
INVENTOR(S) : Li et al.

It is certified that error appears in the above-identified patent and that said Letters Patent is hereby corrected as shown below:

Column 3,
Line 15, please delete "is-processed" after "wafers" and insert -- is processed --.

Column 4,
Line 29, please delete "oxynitnde" after "and silicon" and insert -- oxynitride --.
Line 42, please delete "Internal" before "surface" and insert -- internal --.

Column 6,
Line 27, please delete "a" after "enhance".

Column 7,
Line 6, please delete "density" after "to" and insert -- densify --.
Line 10, please delete "plasma:" after "the" and insert -- plasma. --.

Column 10,
Line 58, please insert -- one -- after "silane and".

Signed and Sealed this

Eleventh Day of October, 2005

JON W. DUDAS
*Director of the United States Patent and Trademark Office*